United States Patent [19]

Borden et al.

[11] 4,063,348

[45] Dec. 20, 1977

[54] UNIQUE PACKAGING METHOD FOR USE ON LARGE SEMICONDUCTOR DEVICES

[75] Inventors: Raymond Walter Borden, Farmingdale; James Edward DeBard, Eatontown, both of N.J.

[73] Assignee: The Bendix Corporation, Teterboro, N.J.

[21] Appl. No.: 713,072

[22] Filed: Aug. 9, 1976

Related U.S. Application Data

[62] Division of Ser. No. 553,778, Feb. 27, 1975, abandoned.

[51] Int. Cl.² .............................................. B01J 17/00
[52] U.S. Cl. ....................................... 29/588; 29/589; 357/79
[58] Field of Search ................................ 29/588, 589

[56] References Cited

U.S. PATENT DOCUMENTS

| 3,192,454 | 6/1965 | Rosenheinrich | 357/79 |
| 3,480,844 | 11/1969 | Lewis | 357/79 |
| 3,512,249 | 5/1970 | Lewis | 29/588 |

FOREIGN PATENT DOCUMENTS

| 1,070,092 | 5/1967 | United Kingdom | 357/79 |

Primary Examiner—W. Tupman
Attorney, Agent, or Firm—Anthony F. Cuoco

[57] ABSTRACT

A silicon controlled rectifier having a triangular base with a planar mounting surface and holes at the apices of the angles to receive screws for mounting the rectifier to a heat sink surface. A cylindrical anode is connected to the base and a semiconductor pellet is positioned on the base within the cylindrical anode. A spring loaded cathode tube is positioned coaxially within the cylindrical anode in engagement with the semiconductor pellet and a spring loaded gate is positioned coaxially within the cathode tube in engagement with the pellet to pressure mount the pellet on the base.

3 Claims, 7 Drawing Figures

UNIQUE PACKAGING METHOD FOR USE ON LARGE SEMICONDUCTOR DEVICES

This is a division of application Ser. No. 553,778, filed Feb. 27, 1975 and now abandoned.

The invention relates to semiconductor devices and more particularly to packaging such devices.

PRIOR ART

Heretofore, semiconductors, such as silicon controlled rectifiers used in power systems and requiring large current capacity, were packaged with a massive base, a threaded mounting stud of substantial diameter and overly generous insulators. In addition, the control leads were offset and the closures were crimped. These features resulted in excess weight and large size. Heat sinks were ineffective because the semiconductor was mounted on the heat sink by the threaded stud which made only limited contact with the heat sink surface. Crimped closures precluded smooth surface terminations required for use of spring type connectors. The traditional package required the control lead to be offset from a central point of contact on the semiconductor pellet and resulted in additional height.

SUMMARY OF THE INVENTION

A semiconductor device carrying large currents when packaged in accordance with the present invention can be relatively small in size and light in weight. Height is reduced by locating the control lead in the package to coincide with its connection to the semiconductor pellet. The seal portion of the package is designed with a ceramic insulator which is compressed during assembly to reduce its bulk. A thin metal diaphragm is used to avoid close tolerances and welding is used as a final closure method to eliminate the height required for crimping as used heretofore. Portions of the package including the base and body have been reduced to minimum size and weight compatible with strength and electrical requirements. The large hex and threaded stud for mounting have been eliminated in favor of a triangular base having a planar mounting surface and holes at the apices of the angles to receive screws for mounting the package to a heat sink surface. This substantially reduces height and weight for more efficient heat transfer by eliminating excess material. Compression bonding of all internal electrical connections may be used and complete compatibility with solder electrical connections to the semiconductor pellet is maintained. Some devices using solder techniques may be further reduced in height and weight by eliminating internal hardware required by compression bonding.

The invention contemplates a semiconductor device comprising a base, a cylindrical electrode connected to the base, a semiconductor pellet on the base within the cylindrical electrode, and at least one spring loaded electrode coaxial with the cylindrical electrode and engaging the pellet opposite the base to pressure mount the pellet on the base.

The invention also contemplates a method of assembling a semiconductor device comprising securing a diaphragm with an aperture therein by means of insulation to a ring-shaped electrode, assembling a spring member on a cylindrical electrode having a flange at one end and inserting the cylindrical electrode through the aperture in the diaphragm and attaching the cylindrical electrode to the diaphragm with the spring-like member in relaxed position, assembling a tube-like member to a base and positioning a semicondcutor pellet within the tube-like member on the base, positioning the flange of the cylindrical electrode on the semiconductor pellet and compressing the spring member until the ring-shaped electrode engages the tube-like member on the base, and securing the ring-shaped electrode to the tube-like member with the spring member under compression.

DRAWINGS

FIG. 1 is a vertical sectional view of a silicon controlled rectifier constructed according to the invention, FIG. 2 is a vertical sectional view of the base body assembly, FIG. 3 is a vertical sectional view of the cathode gate tube assembly, FIG. 4 is a vertical sectional view of the anode diaphragm assembly, FIG. 5 is a vertical sectional view showing a subassembly including the cathode gate tube assembly and the anode diaphragm assembly, FIG. 6 is a perspective view of the silicon controlled rectifier shown in FIG. 1 having coaxial terminals, and FIG. 7 is a perspective view of the silicon controlled rectifier having lug type terminals.

DETAILED DESCRIPTION OF THE INVENTION

Figure 1:
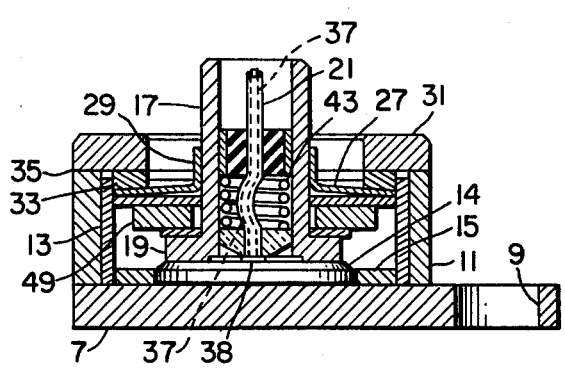

A semicondcutor device constructed according to the invention is shown in FIG. 1 as a silicon controlled rectifier.

Figure 4:
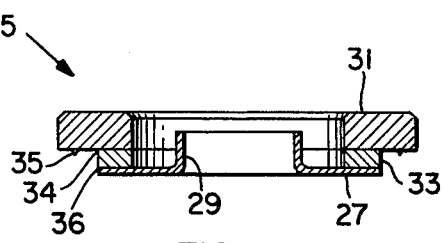
Figure 2:
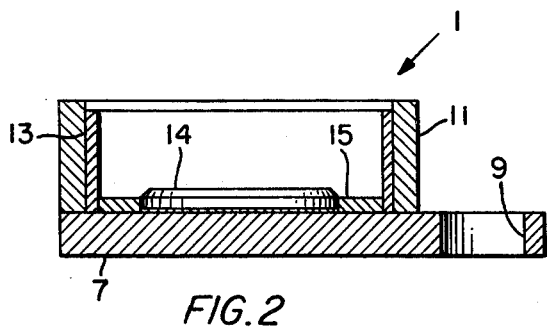
Figure 3:
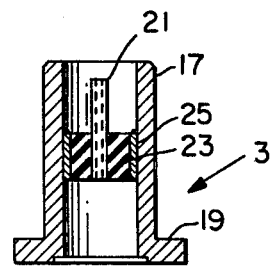

The silicon controlled rectifier includes three subassemblies; a base-body assembly 1 shown in FIG. 2, a cathode gate tube assembly 3 shown in FIG. 3 and an anode diaphragm assembly 5 shown in FIG. 4. The cathode gate tube assembly 3 and the anode diaphragm assembly 5 are assembled into a subassembly shown in FIG. 5 and this subassembly is assembled to the base-body assembly 1 as shown in FIG. 1.

The base-body assembly 1 comprises a triangular base 7 of copper having holes 9 at the apices of the angles for attaching the base with screws to a heat sink (not shown). The base has a planar mounting surface for good heat conduction. A steel tube 11 is brazed to the base and an insulating sleeve 13 is inserted in the steel tube. A semiconductor pellet 14 is centered in tube 11 on base 7 by an annealed silver preformed cup 15 which serves to wet the pellet-base interface to assure intimate electrical and thermal contact at final assembly.

The cathode gate tube assembly 3 shown in FIG. 3 comprises a cathode tube 17 of copper having a flange 19 at one end. A gate tube 21 of nickel iron is centered in cathode tube 17 and is secured thereto by a compression bonded glass seal 23. A steel tube 25 is soldered or brazed to the inner surface of cathode tube 17 for better adherence of the glass seal 23 and to strengthen the bond.

The anode diaphragm assembly 5 shown in FIG. 4 comprises a relatively thin metallic diaphram 27 with a flanged center 29 having a diameter large enough to fit over cathode tube 17. An anode ring 31 of steel is arranged concentrically to diaphragm 27 and an annular ceramic insulator 33 metalized on both flat surfaces 34 and 36 is assembled between diaphragm 27 and anode ring 31 and the metalized surfaces are soldered or brazed to the diaphragm and anode ring. Anode ring 31 has a circular projection 35 suitable for resistance welding for the purpose described below.

Figure 5:
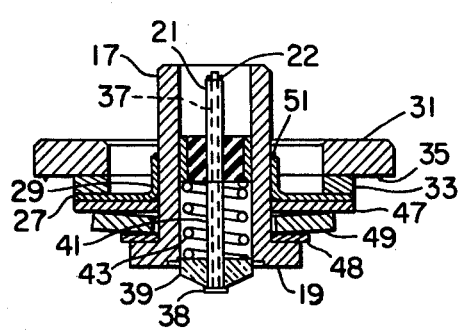

The cathode gate tube assembly 3 and the anode diaphragm assembly 5 are assembled as shown in FIG. 5. A gate nail 37 having a head 38 at one end is inserted through an insulator 39, a short sleeve 41 of insulating material and a compression spring 43 into gate tube 21 of the cathode gate tube assembly. Gate nail head 38 prevents the associated end of the gate nail from passing through insulator 39 and provides an electrical contact with semiconductor pellet 14 as described below. The other end of gate nail 37 is soldered to gate tube 21 as shown at 22.

Two pressure washers 47 and 48 with a Belleville spring 49 therebetween are assembled to cathode gate tube assembly 3 with the lower washer 48 seating on flange 19 of cathode tube 17.

Anode diaphragm assembly 5 then is assembed to cathode gate tube assembly 3 with cathode tube 17 extending through the flanged center 29 of diaphragm 27 and with the diaphragm resting on the uppermost pressure washer 47. Flanged center 29 of diaphragm 27 is soldered or brazed to cathode tube 17 as shown at 51, with Belleville spring 49 and compression spring 43 relaxed.

The subassembly shown in FIG. 5 is then assembled to base-body assembly 1 as shown in FIG. 1. With gate nail head 38 and flange 19 engaging semiconductor pellet 14 Belleville spring 49 and compression spring 43 are compressed until anode ring 31 engages the top of tube 11. A pressure tool (not shown) may be used to apply pressure to anode ring 31 and triangular base 7 while an electric current is passed through the pressure tool to weld circular projection 35 on anode ring 31 to tube 11. Splatter from the weld is shielded from pellet 14 by ceramic insulator 33 and insulating sleeve 13.

During compression of Belleville spring 49 and compression spring 43 insulator 33 is compressed and the portion of gate nail 37 between insulator 39 and gate tube 21 bends to accommodate compression spring 43. This insures good contact between gate nail head 38 and semiconductor pellet 14 even though the semiconductor device is exposed to large changes in temperature and vibration.

Belleville spring 49 and spring 43 under compression urge flange 19 on cathode tube 17 and head 38 on gate nail 37, respectively, into engagement with semiconductor pellet 14 to insure the cathode tube and gate nail making good contact with the semiconductor pellet.

Figure 7:
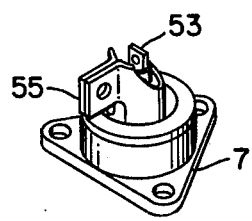
Figure 6:
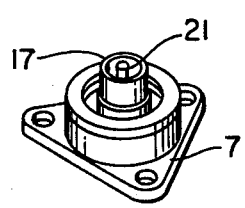

The coaxial terminals on gate tube 21 and cathode tube 17 shown in FIG. 6 may be used if desired or traditional lug terminals 53 and 55 may be secured to coaxial gate tube 21 and to cathode tube 17, respectively, as shown in FIG. 7.

The packaging arrangement providing coaxial terminals in accordance with the invention may be utilized to reduce the weight and size of semiconductor devices carrying large currents where weight and size are prime considerations.

While a silicon controlled rectifier having coaxial anode, cathode and gate terminals positioned directly above the semiconductor pellet is shown in the present embodiment, the gate terminal can be eliminated to provide a diode, or any other type semiconductor can be made in accordance with the above invention.

What is claimed is:

1. A method of assembling a semiconductor device comprising securing a diaphragm with an aperture therein by means of insulation to a ring-shaped electrode, assembling a spring member on a cylindrical electrode having a flange at one end and inserting the cylindrical electrode through the aperture in the diaphragm and attaching the cylindrical electrode to the diaphragm with the spring-like member in relaxed position between the flange and the diaphragm, assembling a tube-like member to a base and positioning a semiconductor pellet within the tube-like member on the base, positioning the flange of the cylindrical electrode on the semiconductor pellet and compressing the spring member until the ring-shaped electrode engages the tube-like member on the base, and securing the ring-shaped electrode to the tube-like member with the spring member under compression.

2. The method described in claim 1 including the steps of assembling a spring compressible electrode coaxial with the cylindrical electrode and insulated therefrom so that the spring compressible electrode contracts and engages the semiconductor pellet under compression when the other two electrodes are assembled to the base assembly.

3. A method of assembling a semiconductor device as described in claim 1 including the step of assembling a cup-shaped member to the base within the tube-like member to receive the semiconductor pellet and maintain the semiconductor pellet in centered position within the tube-like member on the base and provide an electrical interface between the base and the pellet.

* * * * *